United States Patent
Yoshida et al.

(10) Patent No.: US 7,288,315 B2
(45) Date of Patent: *Oct. 30, 2007

(54) GAS-BARRIER MATERIAL

(75) Inventors: Shigenobu Yoshida, Ushiku (JP); Chiharu Okawara, Ushiku (JP); Soko Yamagami, Ushiku (JP); Tooru Hachisuka, Ushiku (JP)

(73) Assignee: Mitsubishi Plastics, Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/604,835

(22) Filed: Nov. 28, 2006

(65) Prior Publication Data

US 2007/0092717 A1    Apr. 26, 2007

Related U.S. Application Data

(63) Continuation of application No. 10/504,085, filed as application No. PCT/JP03/02130 on Feb. 26, 2003, now Pat. No. 7,166,353.

(30) Foreign Application Priority Data

Feb. 28, 2002    (JP) .............................. 2002-53163

(51) Int. Cl.
*B32B 9/00* (2006.01)

(52) U.S. Cl. ...................................... 428/336; 428/451

(58) Field of Classification Search ................ 428/451, 428/336
See application file for complete search history.

(56) References Cited

U.S. PATENT DOCUMENTS

| 6,395,209 | B2 | 5/2002 | Yoshida et al. ............. 264/137 |
| 6,602,564 | B1 | 8/2003 | Komori et al. ............ 428/34.9 |

FOREIGN PATENT DOCUMENTS

| EP | 0806448 A2 | 11/1997 |
| EP | 0905174 A2 | 3/1999 |
| JP | 7-18443 A | 1/1995 |
| JP | 7-276571 A | 10/1995 |
| JP | 10-6429 A | 1/1998 |
| JP | 2001-158069 A | 6/2001 |
| WO | WO 00/10803 | 2/2000 |
| WO | WO 02/32659 A1 | 4/2002 |

*Primary Examiner*—D. S. Nakarani
(74) *Attorney, Agent, or Firm*—Nixon & Vanderhye P.C.

(57) ABSTRACT

A gas-barrier laminate comprising a base film, a thin film formed on the base film and comprising a metal compound selected from the group consisting of oxides, carbides and nitrides of metals, and mixtures thereof, and a plastic film formed on the metal compound thin film in which a film obtained by forming the metal compound thin film on the base film is subjected to a heat treatment, and having an oxygen permeability of not more than 2 $cc/m^2/day/atm$, wherein when the laminate is subjected to hydrothermal treatment at 120° C. for 30 min, a change in oxygen permeability of the laminate between before and after the hydrothermal treatment is not more than 5.

4 Claims, No Drawings

GAS-BARRIER MATERIAL

This application is a continuation of application Ser. No. 10/504,085 filed Aug. 11, 2004, now U.S. Pat. No. 7,166,353, which in turn is a U.S. national phase of PCT/JP03/02130 filed Feb. 26, 2003 which claims priority of Japanese application 2002-53163, filed Feb. 28, 2002.

TECHNICAL FIELD

The present invention relates to a gas-barrier material, and more particularly to a gas-barrier material suitable for packaging foods, medicines, etc., which are subjected to hydrothermal treatments such as retort treatment and sterilization treatment.

BACKGROUND ARTS

Hitherto, as packaging materials to be sterilized by hydrothermal treatments, there have been frequently used laminates prepared by bonding an aluminum foil and a film with each other, and deposited films prepared by vapor-depositing aluminum on a surface of the film. However, since such packaging materials are opaque due to aluminum used therein, there is caused such a problem that resultant packages filled with contents are no longer subjected to inspections for metal foreign materials in the contents and appearance of the contents.

Consequently, in recent years, there have been proposed many high-transparency gas-barrier films that are prepared by forming a metal oxide thin film comprising silicon oxide, aluminum oxide or magnesium oxide which has a thickness of 10 to 100 nm, on the surface of a base plastic film. These gas-barrier films are usually in the form of a laminate further including a separate plastic film layer laminated on the metal oxide thin film, and are used as packaging materials for foods, medicines or the like.

It has been expected that the above gas-barrier laminates are used as retort packaging materials. However, in such application fields, the packaging materials have been required to still maintain the gas-barrier property even after being subjected to hydrothermal treatments.

However, the metal oxide thin film formed in the above laminates tend to be readily broken upon the hydrothermal treatments, resulting in remarkable deterioration in gas-barrier property thereof. The gas-barrier property of the laminates may be maintained by increasing the thickness of the metal oxide thin film, for example, up to about 50 nm or more. In this case, however, the productivity of the laminates tends to be deteriorated, resulting in increased production costs. Further, there may arise problems such as poor transparency of the obtained laminates.

On the other hand, there have been proposed the method of subjecting a deposited film including a metal oxide thin film to heat treatment as a post treatment thereof for a short period of time, e.g., for a period of from about several seconds to about one minute in order to enhance an adhesion between the metal oxide thin film and the other plastic film layer (Japanese Patent Application Laid-open (KOKAI) No. 55-84332(1980)), and the method of forcibly irradiating a deposited film with a visible light for a long period of time to enhance a transparency of the film and stabilize a gas-barrier property thereof (Japanese Patent Application Laid-open (KOKAI) No. 8-197674). However, these conventional methods have failed to attain the effect of improving a gas-barrier property of the gas-barrier films having the metal oxide thin film after the hydrothermal treatments.

On the other hand, there have been proposed the method of successively subjecting a deposited film to water or moisture absorption treatment and then heat treatment in order to maintain a transparency of the film and improve a gas-barrier property thereof (Japanese Patent Application Laid-open (KOKAI) No. 2-299826), and the method of heat-treating a laminated film including a biaxially stretched film having a metal oxide thin film, and the other film laminated on the metal oxide thin film through an adhesive resin layer, for a short period of time at a temperature of from a second-order transition point to a melting point of the biaxially stretched film, more specifically at about 200° C. at which the adhesive resin layer can be melted, while preventing heat shrinkage of the film, in order to improve a gas-barrier property thereof (Japanese Patent Application Laid-open (KOKAI) No. 8-300549). However, in these conventional methods, although these films are improved in gas-barrier property, retort packaging materials prepared from the laminate using the deposited film are still insufficient in gas-barrier property after the hydrothermal treatments. Further, in the above prior arts, it is not described at all to maintain the good gas-barrier property after the hydrothermal treatments.

In addition, in Japanese Patent Application Laid-open (KOKAI) No. 3-16728, it has been reported that a deposited polyester film having a polyester-based anchor coat layer which undergoes heat history at not lower than the glass transition temperature during the production process of the deposited polyester film, can exhibit a good adhesion between the based polyester film and the deposited layer even when the deposited polyester film is subjected to hydrothermal treatments. However, the heat history specified therein is only an ordinary heat treatment generally used upon vapor deposition steps or film-stretching/heat-treating steps during the production process of deposited films.

The present invention has been made in view of the above conventional problems. An object of the present invention is to provide a gas-barrier film which can exhibit a less deterioration in gas-barrier property upon or after hydrothermal treatments, as well as a laminate including the gas-barrier film.

DISCLOSURE OF THE INVENTION

As a result of the present inventors' earnest studies for accomplishing the above object, it has been found that when a gas-barrier film provided with a thin film comprising a metal compound selected from the group consisting of oxides, carbides and nitrides of metals, and mixtures thereof, is heat-treated under specific conditions, a laminate including the gas-barrier film can be prevented from being deteriorated in gas-barrier property even when being subjected to hydrothermal treatments. The present invention has been attained on the basis of the above finding.

That is, the present invention includes the following aspects that are closely related to each other.

In a first aspect of the present invention, there is provided a gas-barrier film comprising a base film and a thin film formed on the base film which has a thickness of 3 to 20 nm and comprises a metal compound selected from the group consisting of oxides, carbides and nitrides of metals, and mixtures thereof, which gas-barrier film has an oxygen permeability of not more than 3 $cc/m^2/day/atm$ and has such a property that when a laminate comprising the gas-barrier film and an unstretched polypropylene film having a thickness of 50 μm which is laminated on the metal compound thin film of the gas-barrier film is subjected to a hydrothermal treatment at 120° C. for 30 min, a change in oxygen permeability of the laminate between before and after the hydrothermal treatment (after/before) is not more than 5.

In a second aspect of the present invention, there is provided a gas-barrier film comprising a base film and a thin film formed on the base film and comprising a metal compound selected from the group consisting of oxides, carbides and nitrides of metals, and mixtures thereof in which a film obtained by forming the thin film on the base film is subjecting to a heat treatment, which gas-barrier film has an oxygen permeability of not more than 3 cc/m$^2$/day/atm and has such a property that when a laminate comprising the gas-barrier film and an unstretched polypropylene film having a thickness of 50 μm which is laminated on the metal compound thin film of the gas-barrier film is subjected to hydrothermal treatment at 120° C. for 30 min, a change in oxygen permeability of the laminate between before and after the hydrothermal treatment (after/before) is not more than 5.

In a third aspect of the present invention, there is provided a gas-barrier laminate comprising a base film, a thin film formed on the base film which has a thickness of 3 to 20 nm and comprises a metal compound selected from the group consisting of oxides, carbides and nitrides of metals, and mixtures thereof, and a plastic film formed on the metal compound thin film, which gas-barrier laminate has an oxygen permeability of not more than 2 cc/m$^2$/day/atm and has such a property that when the laminate is subjected to hydrothermal treatment at 120° C. for 30 min, a change in oxygen permeability of the laminate between before and after the hydrothermal treatment (after/before) is not more than 5.

In a fourth aspect of the present invention, there is provided a gas-barrier laminate comprising a base film, a thin film formed on the base film and comprising a metal compound selected from the group consisting of oxides, carbides and nitrides of metals, and mixtures thereof, and a plastic film formed on the metal compound thin film in which a film obtained by forming the metal compound thin film on the base film is subjected to a heat treatment, which gas-barrier laminate has an oxygen permeability of not more than 2 cc/m$^2$/day/atm and has such a property that when the laminate is subjected to hydrothermal treatment at 120° C. for 30 min, a change in oxygen permeability of the laminate between before and after the hydrothermal treatment is not more than 5.

In a fifth aspect of the present invention, there is provided a gas-barrier laminate comprising a base film, a thin film formed on the base film and comprising a metal compound selected from the group consisting of oxides, carbides and nitrides of metals, and mixtures thereof, and a plastic film formed on the metal compound thin film in which a laminated film obtained after forming the plastic film on the metal compound thin film formed on the base film is subjected to a heat treatment, which gas-barrier laminate has an oxygen permeability of not more than 2 cc/m$^2$/day/atm and has such a property that when the laminate is subjected to hydrothermal treatment at 120° C. for 30 min, a change in oxygen permeability of the laminate between before and after the hydrothermal treatment (after/before) is not more than 5.

The present invention is described in detail below.

The gas-barrier film of the present invention means a film including a base film, and a thin film formed on the base film and comprising a metal compound selected from the group consisting of oxides, carbides and nitrides of metals, and mixtures thereof. Also, the gas-barrier laminate of the present invention means a laminate including the above gas-barrier film and a plastic film formed on the metal compound thin film of the gas-barrier film.

As the base film, any suitable plastic films may be used without particular limitations as long as they are applicable to ordinary packaging materials. Specific examples of the base film may include films comprising raw materials including polyolefins such as homopolymers and copolymers of ethylene, propylene, butene, etc., amorphous polyolefins such as cyclic polyolefins, polyesters such as polyethylene terephthalate and polyethylene-2,6-naphthalate, polyamides such as nylon 6, nylon 66, nylon 12 and copolymerized nylon, partially hydrolyzed products of ethylene-vinyl acetate copolymer (EVOH), polyimides, polyether imides, polysulfones, polyether sulfones, polyether ether ketones, polycarbonates (PC), polyvinyl butyral, polyallylates, fluororesins, acrylate resins or the like. Of these materials, preferred are polyesters, polyamides, polyolefins and partially hydrolyzed products of ethylene-vinyl acetate copolymer, and more preferred are polyesters and polyamides.

The above base film may be produced by conventionally known ordinary methods. Although the base film may be in the form of either an unstretched film or a stretched film, the stretched film is preferably used. Also, the base film may be in the form of a laminated film prepared by laminating a plurality of resin films with each other. The thickness of the base film may be appropriately selected from the range of usually 5 to 500 μm, preferably 10 to 200 μm according to properties required as a base material of the laminate of the present invention in various applications, such as mechanical strength, flexibility and transparency. In addition, the width and length of the base film are not particularly restricted, and may be appropriately selected according to the applications thereof.

The base film is preferably coated with an anchor coat agent in order to enhance adhesion between the base film and the metal compound. Examples of the anchor coat agent may include solvent-soluble or water-soluble polyester resins, isocyanate resins, urethane resins, acrylic resins, vinyl alcohol resins, ethylene-vinyl alcohol resins, vinyl-modified resins, epoxy resins, oxazoline group-containing resins, modified styrene resins, modified silicone resins, alkyl titanates, or the like. These anchor coat agents may be used alone or in the combination of any two or more thereof.

The gas-barrier film having a layer structure in which the base film, the anchor coat layer and the metal compound thin film are successively laminated with each other, preferably has a critical load of not less than 2.0 μN when conducting a nano-scratch measurement on the surface of the metal compound thin film.

The nano-scratch measurement is such a method in which physical properties are evaluated by conducting a scratch test in a nanometer scale. This method is generally explained as follows. That is, when a thin film formed on a substrate is scratched in a lateral direction thereof (in-plane direction) with a diamond indentator while applying a normal ultrafine force thereto, a shearing stress is caused on the thin film and the boundary face between the thin film and the substrate. Since there is a proportional relationship between the shearing stress and the normal force applied to the indentator according to theoretical calculation proposed by Benjamin et al., it becomes possible to evaluate an adhesion property of the thin film from the normal force at which the indentator reaches the boundary face.

In the present invention, the above shearing stress is varied depending upon three factors including the metal compound thin film, a boundary face between the metal compound thin film and the anchor coat layer, and a boundary face between the anchor coat layer and the base film.

In the nano-scratch measurement, as the normal force applied gradually increases, a normal displacement and a lateral force also increase. When reaching a certain normal force, there is observed an inflection point at which the increase in normal displacement is blunted. At that time, it is considered that any separation or peeling at the boundary faces or any shear failure is caused.

In the present invention, the normal force applied at the time at which the inflection point is observed, namely blunting of the increase in normal displacement is initiated, is defined as a "critical load", and used as a scale for expressing the degree of adhesion property.

The gas-barrier film having a critical load of not less than 2.0 µN is excellent in adhesion between the respective layers including the base film, the anchor coat layer and the metal compound thin film as a whole. Therefore, the gas-barrier film can maintain a high gas-barrier property without the below-mentioned heat treatment. The above critical load is preferably not less than 4.0 µN, and the upper limit of the critical load is usually 300 µN (practically 100 µN).

The gas-barrier film capable of satisfying the above critical load can be achieved by appropriately selecting the resin constituting the anchor coat layer. In particular, it is recommended to use an anchor coat agent containing an oxazoline group-containing resin and at least one resin selected from the group consisting of acrylic resins, urethane resins and polyester resins (refer to Japanese Patent Application Laid-open (KOKAI) No. 11-179836). The use of such an anchor coat agent enables effects of the heat treatment according to the present invention to be readily exhibited. The anchor coat agent is preferably prevented from being softened upon the heat treatment. The above requirement can be achieved by the selective use of the above-mentioned anchor coat agents.

The content of the oxazoline group-containing resin in the anchor coat agent is usually 6 to 80% by weight, preferably 10 to 60% by weight. The content of the acrylic resin in the anchor coat agent is usually 10 to 80% by weight, whereas the content of the urethane resin and/or polyester resin in the anchor coat agent is usually 10 to 80% by weight.

The anchor coat agent may be applied on the based film by any known coating methods. The thickness of the anchor coat layer is usually 0.005 to 5 µm, preferably 0.01 to 1 µm. When the thickness of the anchor coat layer exceeds 5 µm, the resultant film tends to be deteriorated in slip property, or the anchor coat layer as a surface-modifying layer itself tends to be separated from the base film or sheet owing to its internal stress. When the thickness of the anchor coat layer is less than 0.005 µm, the anchor coat layer tends to have a non-uniform thickness, and as a result, the surface-modifying layer may fail to exhibit sufficient functions thereof.

The anchor coat layer may be formed after formation of the film, but preferably be formed during the film-forming process. In the case where the film is in the form of a biaxially stretched film, there is preferably used such a coating method (in-line coating method) in which after the anchor coat agent is applied onto a longitudinally monoaxially stretched film or sheet, the coated film or sheet in a dried or undried state is stretched in transverse direction, and then heat-treated. In such a method, film formation, coating and drying can be conducted at the same time, resulting in large merits in view of production costs. Meanwhile, in order to improve a coatability or adhesion of the anchor coat layer to the film, the surface of the film or sheet may be previously subjected to chemical treatment or discharge treatment before coating.

Examples of metals constituting the metal compound thin film formed on the base film may include silicon, aluminum, silicon, magnesium, zinc, tin, nickel and titanium. These metals may be used in the form of oxides, carbides or nitrides of the metals, or mixtures thereof. Of these metal compounds, preferred are silicon oxide and aluminum oxide. In particular, silicon oxide is especially preferable because the thin film formed therefrom can remarkably exhibit the effects of the heat treatment according to the present invention and can stably maintain a high gas-barrier property.

The metal compound thin film may be formed by vapor deposition method, coating method, etc., without any particular limitations. Of these methods, preferred is the vapor deposition method, since this method enables formation of a uniform thin film having a high gas-barrier property. Specific examples of the vapor deposition method may include vacuum deposition, ion-plating, sputtering, CVD or the like. Meanwhile, in the course of the process for forming the metal compound thin film on the base film, the films may be generally exposed to some heating conditions. However, the heating conditions are not involved in the below-mentioned specific heat treatment according to the present invention except for special cases.

In general, the thickness of the above metal compound thin film lies in the range of 0.1 to 500 nm. In particular, in the present invention, the thickness of the metal compound thin film is adjusted to the range of usually 0.5 to 40 nm, preferably 1 to 30 nm, more preferably 3 to 20 nm. When the thickness of the metal compound thin film is too small, it may be difficult to attain a sufficient gas-barrier property. On the other hand, when the thickness of the metal compound thin film is too large, there tend to be caused problems such as increased costs and occurrence of cracks or separation on the deposited film.

The metal compound thin film may be provided thereon with a top coat layer in order to enhance adhesion to the plastic film to be laminated thereon. Examples of the top coat agent may include solvent-soluble or water-soluble polyester resins, isocyanate resins, urethane resins, acrylic resins, vinyl alcohol resins, ethylene-vinyl alcohol resins, vinyl-modified resins, epoxy resins, oxazoline group-containing resins, modified styrene resins, modified silicone resins, alkyl titanates or the like. These top coat agents may be used alone or in the combination of any two or more thereof.

The gas-barrier film of the present invention may be used in various applications usually in the form of a gas-barrier laminate prepared by further laminating a plastic film on the metal compound thin film. The thickness of the plastic film may be appropriately selected from the range of usually 5 to 500 µm, preferably 10 to 200 µm according to properties required as a base material of the laminate in the respective applications, such as mechanical strength, flexibility and transparency. The width and length of the plastic film may also be appropriately selected according to the applications thereof without any particular limitations.

The plastic film is preferably a polyolefin-based film as a film or sheet that can be hydrothermally treated and heat-sealed. In addition, the plastic film is more preferably a biaxially stretched polyester film and a biaxially stretched nylon film which are films having an excellent mechanical strength.

Also, the metal compound thin film may be formed in at least one layer space between the respective two or more plastic base films. Therefore, the number of the metal compound thin film layer should not be limited to only one layer.

The plastic film may be laminated by any known methods such as dry-lamination method and extrusion-lamination method. In these methods, the plastic film may be laminated through an adhesive such as urethane-based, polyester-based and acrylic-based adhesives.

When the gas-barrier film is applied to a packaging material, it is conventionally known that the gas-barrier film is used in the form of a laminate including a nylon film that is bonded between the gas-barrier film and a sealant film in order to improve mechanical properties thereof such as pinhole resistance. However, in general, since the nylon film undergoes remarkable heat shrinkage upon the hydrothermal treatments, there tends to arise such a problem that the metal compound thin film is broken owing to the difference in shrinkage percentage between the respective layers, so that the gas-barrier property of the laminate tends to be deteriorated after retort treatment. On the contrary, the laminate including the gas-barrier film of the present invention is less influenced by the above problems, thereby enabling the nylon film to be used as a constituting layer of the laminate.

Examples of the nylon may usually include nylon 6, nylon 66, m-xylene adipamide, etc. The thickness of the nylon film is usually 10 to 30 μm, preferably 15 to 25 μm. When the thickness of the nylon film is less than 10 μm, the film tends to be insufficient in strength. When the thickness of the nylon film is more than 30 μm, the film exhibits a too high firmness and is, therefore, unsuitable for processing. The nylon film is preferably in the form of a biaxially stretched film that is stretched in each of longitudinal and transverse directions at a stretch ratio of usually not less than 2 times, preferably about 2.5 to 4 times. Such a nylon film exhibits a good pinhole resistance (number of pinholes in 3,000 cycle Gelbo-Flex test at 23° C. and 50% RH: usually not more than 50 per m$^2$), as well as a good pin-puncture strength. In addition, even nylon films having a certain heat shrinking property are also usable in the present invention, as long as a maximum shrinkage percentage thereof as measured, for example, under hydrothermal treatment conditions at 120° C. for 30 min, is usually not more than about 15%. Specifically, there may be especially preferably used generally used biaxailly successively stretched 6-nylon films.

The total thickness of the gas-barrier laminate according to the present invention is usually 50 to 5000 μm, preferably 60 to 2000 μm. The gas-barrier laminate may further include a printed layer or an ultraviolet absorber-containing layer on the surface of the laminate or between the respective layers thereof in order to impart a light-shielding property or an ultraviolet-shielding property thereto. In addition, in order to prevent deterioration of contents due to oxygen, a layer containing an oxygen absorber such as iron particles may also be formed on the surface of the laminate or between the respective layers thereof. The oxygen absorber-containing layer is preferably disposed on the surface of the metal compound thin film that comes into contact with the contents.

The gas-barrier film of the present invention has an oxygen permeability of usually not more than 3 cc/m$^2$/day/atm, preferably not more than 2 cc/m$^2$/day/atm. The lower limit of the oxygen permeability of the gas-barrier film is usually not less than 0.05 cc/m$^2$/day/atm. The gas-barrier laminate prepared by further laminating the plastic film on the gas-barrier film has an oxygen permeability of usually not more than 2 cc/m$^2$/day/atm, preferably not more than 1 cc/m$^2$/day/atm. The lower limit of the oxygen permeability of the gas-barrier laminate is usually not less than 0.01 cc/m$^2$/day/atm.

The gas-barrier film and the gas-barrier laminate having an oxygen permeability in the above-specified ranges are involved within merely existing so-called high performance gas-barrier films. However, the gas-barrier film and the gas-barrier laminate according to the present invention are characterized in that the gas-barrier property thereof is less deteriorated even after being subjected to the hydrothermal treatments such as so-called retort treatment.

More specifically, in the gas-barrier laminate which is produced by forming the metal compound thin film on the base film and then subjecting the resultant film to heat treatment, and further forming the plastic film on the metal compound thin film, the change in oxygen permeability of the laminate between before and after subjecting the laminate to hydrothermal treatment (after/before) at 120° C. for 30 min, is usually not more than 5, preferably not more than 4, more preferably not more than 3. The lower limit of the change in oxygen permeability of the gas-barrier laminate is usually not less than 1.

In addition, in the gas-barrier laminate which is produced by forming the metal compound thin film on the base film, forming the plastic film on the inorganic thin film and then subjecting the resultant laminate to heat treatment, the change in oxygen permeability of the laminate between before and after subjecting the laminate to hydrothermal treatment (after/before) at 120° C. for 30 min, is usually not more than 5, preferably not more than 4, more preferably not more than 3. The lower limit of the change in oxygen permeability of the gas-barrier laminate is usually not less than 1.

In addition, in the gas-barrier film which is produced by forming the metal compound thin film on the base film and then subjecting the resultant film to heat treatment, when a laminate prepared by forming a 50 μm-thick unstretched polypropylene film on the gas-barrier film is subjected to hydrothermal treatment at 120° C. for 30 min, the change in oxygen permeability of the laminate between before and after the hydrothermal treatment (after/before) is usually not more than 5, preferably not more than 4. The lower limit of the change in oxygen permeability of the laminate is usually not less than 1. Further, the oxygen permeability after the hydrothermal treatment is preferably not more than 7 cc/m$^2$/day/atm, more preferably not more than 5 cc/m$^2$/day/atm, especially preferably not more than 3 cc/m$^2$/day/atm.

In order to effectively exhibit the above properties, there may be preferably used such a method in which the gas-barrier material is preferably heat-treated under the specific conditions mainly in the form of the gas-barrier film or the gas-barrier laminate, though not limited thereto. When the gas-barrier laminate is subjected to the heat treatment, there may be use either the method of subjecting a container or bag fabricated from the laminate to the heat treatment or the method of subjecting the fabricated container filled with contents to the heat treatment.

Although optimum conditions of the heat treatment varies depending upon kind and thickness of the respective components constituting the gas-barrier film or the gas-barrier laminate, there may be used any method as long as the time and temperature used therein can be maintained as required. For example, there may be used the method of preserving the film or laminate in an oven or constant-temperature chamber set to the temperature as required, the method of blowing a hot air to the film or laminate, the method of heating the film or laminate by an infrared heater, the method of irradiating the film or laminate with light from a lamp, the method of directly applying heat to the film or laminate by contacting with a heated roll or a heated plate, or the method of irradiating the film or laminate with a microwave. In this case, the film or laminate may be cut into a size easy to handle, and then subjected to the heat treatment. Alternatively, the rolled film or laminate may be directly subjected to the heat treatment. In addition, as long as the required time and temperature are ensured, a preferable heating device may be assembled into a part of the film-forming apparatus such as a coater and a slitter.

The temperature used in the heat treatment of the present invention is not particularly restricted as long as the temperature lies within the range of usually from 60° C. to the melting point of the plastic film or sheet used. The lower limit of the heat-treating temperature is usually not lower than 60° C., preferably not lower than 70° C. The upper limit of the heat-treating temperature is usually not higher than 200° C., preferably not higher than 160° C. When the heat-treating temperature is lower than 60° C., the time required until exhibiting the effects of the heat treatment is extremely prolonged, resulting in unpractical process.

The heat-treating time tends to be shortened as the heat-treating temperature is raised. Further, when the heat-treating temperature is high, there is such a tendency that the gas-barrier film is deteriorated in gas-barrier property due to heat decomposition of components thereof. Therefore, the use of too long heat-treating time should be avoided. Consequently, the preferable heat-treating conditions include, for example, from 3 days to 6 months at 60° C., from 3 hours to 10 days at 80° C., from one hour to one day at 120° C. and from about 3 to 60 min at 150° C., though not particularly limited thereto.

As to the above-described optimum heat-treating time, the following correlation formula is derived from experimental results. That is, the optimum heat-treating time t (s) is calculated from the heat-treating temperature T (K) according to the following formula:

$$3.6 \times 10^{-10} e^{(1000/T)} < t < 2.4 \times 10^{-10} e^{(13500/T)}$$

In the gas-barrier laminate of the present invention, the adhesion strength between the base film and the metal compound thin film as measured after subjecting the laminate to the hydrothermal treatment at 120° C. for 30 min, is usually not less than 100 g/15 mm, preferably not less than 200 g/15 mm. Also, the change in shrinkage percentage of the gas-barrier laminate between before and after subjecting the laminate to the hydrothermal treatment is usually not more than 3%, preferably not more than 2%.

BEST MODE FOR CARRYING OUT THE INVENTION

The present invention is described in more detail by the following examples, but these examples are only illustrative and not intended to limit the present invention thereto. Meanwhile, in the following Examples and Comparative Examples, the properties of films were measured and evaluated by the following methods.

(1) Oxygen permeability ($cc/m^2/day/atm$):

The oxygen permeability was measured at a temperature of 25° C. and a relative humidity of 80% using an oxygen permeability measuring apparatus "OX-TRAN100" manufactured by Modern Control Corp., according to ASTM-D3985.

(2) Nano-scratch measurement:

The nano-scratch measurement was conducted using "Triboscope System" manufactured by Hysitron Incorporated, and a 60° conical diamond indentator having a radius of curvature of about 1 µm at a tip end thereof. The indentator had such a condition that when $SiO_2$ thermal oxidation film-25 nm/Si wafer produced by Ulvac-Phi Inc., was measured as a control sample, a normal displacement was 4 nm upon applying a normal force of 57 µN thereto. Upon the measurement, the gas-barrier film was adsorbed and fixed onto a sampling base (substrate) and subjected to a continuous loading test at a loading speed of about 1 µN/sec and a scratch speed of about 133 nm/sec three or more times ($n \geq 3$) to calculate a average critical load thereof.

(3) Determination of softening of anchor coat layer upon heat treatment:

The measurement was conducted using a micro-thermal analyzer "µ-TA Device" manufactured by T. A. Instruments. This apparatus was equipped with a sensor having a detecting portion made of a wire folded into a V-shape at a tip end thereof. Upon the measurement, a sample prepared by forming an anchor coat layer on a base film was tested at a temperature rise rate of 10° C./min under an indentation force of 20 nA while bringing the V-shaped detecting portion of the sensor into contact with a surface of the anchor coat layer. The softening of the anchor coat layer was determined when the sensor was moved downward.

EXAMPLE 1

A 170 µm-thick unstretched polyethylene terephthalate film was coated with a mixed resin (referred to as "composition A" in Tables) containing 60% by weight of an oxazoline group-containing polymer "EPOCROS WS-500" produced by Nippon Shokubai Co., Ltd., 20% by weight of an aqueous acrylic resin (resin A as shown below) and 20% by weight of an aqueous urethane resin (resin B as shown below) by an in-line coating method, and biaxially stretched at a stretch ratio of 3.5 times in the longitudinal direction and 4.0 times in the transverse direction, thereby obtaining a 12 µm-thick biaxially stretched polyethylene terephthalate film provided thereon with a surface-modifying layer as the mixed resin layer having a thickness of 0.1 µm. Next, silicon oxide (SiO) was vapor-deposited on the surface-modifying layer using a vacuum deposition apparatus by a high-frequency heating method to obtain a deposited plastic film formed thereon with a vapor-deposited layer of $SiO_x$ having a thickness of about 15 nm. As a result, it was confirmed that the thus obtained deposited plastic film had an oxygen permeability of 1.8 $cc/m^2 \cdot 24h \cdot atm$.

<Production Conditions of Resin A (Aqueous Acrylic Resin)>

A mixture containing 40 parts by weight of ethyl acrylate, 30 parts by weight of methyl methacrylate, 20 parts by weight of methacrylic acid and 10 parts by weight glycidyl methacrylate was subjected to solution polymerization in ethyl alcohol. After completion of the polymerization, the obtained polymer was heated while adding water thereto to remove ethyl alcohol therefrom. Then, the polymer was mixed with aqueous ammonia to adjust a pH thereof to 7.5, thereby obtaining an aqueous paint comprising an aqueous acrylic-based resin. <Production conditions of resin B (aqueous polyurethane resin)>

First, a polyester polyol was produced from 664 parts by weight of terephthalic acid, 631 parts by weight of isophthalic acid, 472 parts by weight of 1,4-butane diol and 447 parts by weight of neopentyl glycol. Then, the thus obtained polyester polyol was mixed with 321 parts by weight of adipic acid and 268 parts by weight of dimethylolpropionic acid, thereby obtaining a pendant carboxyl group-containing polyester polyol A. Further, 1880 parts by weight of the thus obtained polyester polyol A was mixed with 160 parts by weight of hexamethylenediisocyanate, thereby obtaining an aqueous paint comprising an aqueous polyurethane-based resin.

The above deposited plastic film was cut into a size easy to handle. The cut film was fixedly attached on a plate, placed in an oven at 60° C. and then heat-treated therein for 3 months. Then, an urethane-based adhesive (mixture containing adhesives "AD-900" and "CAT-RT85" both produced by Toyo Morton Co., Ltd., at a blending ratio of 10:1.5) was applied onto a surface of the $SiO_x$ thin film of the heat-treated deposited plastic film, and then dried, thereby forming an adhesive resin layer having a thickness of 4 µm. The thus obtained adhesive resin layer was laminated on a 50 µm-thick unstretched polypropylene film "TOREFAN NO ZK-93K" produced by Toray Synthetic Film Co., Ltd., thereby obtaining a two-layer transparent plastic film. The thus obtained laminated film was aged at 40° C. for 3days to obtain a sample for evaluation. The obtained sample was hydrothermally treated in an autoclave at 120° C. for 30 min to measure an oxygen permeability thereof before and after the hydrothermal treatment. The results are shown in Table 1.

EXAMPLES 2 to 7

The same procedure as defined in Example 1 was conducted except that the heat-treating temperature and time of the deposited plastic film were changed as shown in Table 1. The results are shown in Table 1. In Examples 3 and 7, the sample films were further subjected to nano-scratch measurement and evaluation of softening of the anchor coat layer upon the heat treatment. The results are shown in Table 3.

EXAMPLE 8

The same procedure as defined in Example 1 was conducted except that the mixed resin forming the anchor coat layer was changed to such a mixed resin (referred to as "composition B" in Tables) composed of 35% by weight of an aqueous acrylic resin (resin A as shown below) and 65% by weight of an aqueous urethane resin (resin B as shown below), and the heat-treating temperature and time of the deposited plastic film were changed as shown in Table 1. The results are shown in Table 1.

EXAMPLE 9

The same procedure as defined in Example 1 was conducted except that the mixed resin forming the anchor coat layer was changed to such a mixed resin (referred to as "composition C" in Tables) composed of 50% by weight of an isocyanate compound "COLONATE L" produced by Nippon Polyurethane Industry Co., Ltd., and 50% by weight of a saturated polyester "VILON 300" produced by Toyobo Co., Ltd., and the heat-treating temperature and time of the deposited plastic film were changed as shown in Table 1. The results are shown in Table 1. Further, the sample film was further subjected to nano-scratch measurement and evaluation of softening of the anchor coat layer upon the heat treatment. The results are shown in Table 3.

EXAMPLE 10

The deposited plastic film used in Example 1 was wound up around a core to prepare a film roll. The thus prepared roll of the deposited plastic film was placed in an oven at 80° C. and heat-treated therein for 3 days. Next, the heat-treated deposited plastic film was used to prepare a sample for evaluation by the same method as defined in Example 1. The thus obtained sample was hydrothermally treated at 120° C. for 30 min to measure an oxygen permeability thereof before and after the hydrothermal treatment. The results are shown in Table 1.

EXAMPLE 11

An urethane-based adhesive (mixture containing adhesives "AD-900" and "CAT-RT85" both produced by Toyo Morton Co., Ltd., at a blending ratio of 10:1.5) was applied onto a surface of the $SiO_x$ thin film of the heat-treated deposited plastic film used in Example 10, and then dried, thereby forming an adhesive resin layer having a thickness of 4 µm. The thus obtained adhesive resin layer was laminated on a 15 µm-thick biaxially stretched nylon film "BONEAL SNR" produced by Mitsubishi Chemical Kohjin PAX Corporation, thereby obtaining a two-layer laminated film.

Further, an urethane-based adhesive (mixture containing adhesives "AD-900" and "CAT-RT85" both produced by Toyo Morton Co., Ltd., at a blending ratio of 10:1.5) was applied onto the surface of the biaxially stretched nylon film of the two-layer laminated film, and then dried, thereby forming an adhesive resin layer having a thickness of 4 µm. The thus obtained adhesive resin layer was laminated on a 50 µm-thick unstretched polypropylene film "TOREFAN NO ZK-93K" produced by Toray Synthetic Film Co., Ltd., thereby obtaining a three-layer transparent plastic film. The thus obtained three-layer laminated film was aged at 40° C. for 3 days to prepare a sample for evaluation. The obtained sample was hydrothermally treated in an autoclave at 120° C. for 30 min to measure an oxygen permeability thereof before and after the hydrothermal treatment. The results are shown in Table 1.

EXAMPLE 12

An urethane-based adhesive (mixture containing adhesives "AD-817" and "CAT-RT86" both produced by Toyo Morton Co., Ltd., at a blending ratio of 15:1.5) was applied onto a surface of the $SiO_x$ thin film of the heat-treated deposited plastic film used in Example 10, and then dried, thereby forming an adhesive resin layer having a thickness of 4 µm. The thus obtained adhesive resin layer was laminated on a 50 µm-thick unstretched polypropylene film "TOREFAN NO ZK-93K" produced by Toray Synthetic Film Co., Ltd., thereby obtaining a two-layer laminated film.

Further, an urethane-based adhesive (mixture containing adhesives "AD-900" and "CAT-RT85" both produced by Toyo Morton Co., Ltd., at a blending ratio of 10:1.5) was applied onto a surface of the biaxially stretched polyester film of the two-layer laminated film, and then dried, thereby forming an adhesive resin layer having a thickness of 4 µm. The thus obtained adhesive resin layer was laminated on a 15 µm-thick biaxially stretched nylon film "BONEAL SNR" produced by Mitsubishi Chemical Kohjin PAX Corporation, thereby obtaining a three-layer transparent plastic film. The thus obtained three-layer laminated film was aged at 40° C. for 3 days to obtain a sample for evaluation. The obtained sample was hydrothermally treated in an autoclave at 120° C. for 30 min to measure an oxygen permeability thereof before and after the hydrothermal treatment. The results are shown in Table 1.

EXAMPLE 13

An urethane-based adhesive (mixture containing adhesives "AD-900" and "CAT-RT85" both produced by Toyo Morton Co., Ltd., at a blending ratio of 10:1.5) was applied onto a surface of the $SiO_x$ thin film of the deposited plastic film (non-heat-treated) used in Example 1, and then dried, thereby forming an adhesive resin layer having a thickness of 4 μm. The thus formed adhesive resin layer was laminated on a 50 μm-thick unstretched polypropylene film "TOREFAN NO ZK-93K" produced by Toray Synthetic Film Co., Ltd., thereby obtaining a two-layer transparent plastic film. The thus obtained two-layer laminated film was aged at 80° C. for 3 days to obtain a sample for evaluation. The obtained sample was hydrothermally treated in an autoclave at 120° C. for 30 min to measure an oxygen permeability thereof before and after the hydrothermal treatment. The results are shown in Table 1.

COMPARATIVE EXAMPLE 1

An urethane-based adhesive (mixture containing adhesives "AD-900" and "CAT-RT85" both produced by Toyo Morton Co., Ltd., at a blending ratio of 10:1.5) was applied onto a surface of the $SiO_x$ thin film of the deposited plastic film (non-heat-treated) used in Example 1, and then dried, thereby forming an adhesive resin layer having a thickness of 4 μm. The thus formed adhesive resin layer was laminated on a 50 μm-thick unstretched polypropylene film "TOREFAN NO ZK-93K" produced by Toray Synthetic Film Co., Ltd., thereby obtaining a two-layer transparent plastic film. The thus obtained laminated film was aged at 40° C. for 3 days to prepare a sample for evaluation. The obtained sample was hydrothermally treated in an autoclave at 120° C. for 30 min to measure an oxygen permeability thereof before and after the hydrothermal treatment. The results are shown in Table 2. The sample was further subjected to nano-scratch measurement and evaluation of softening of the anchor coat layer upon the heat treatment. The results are shown in Table 3.

COMPARATIVE EXAMPLE 2

The same procedure as defined in Example 12 was conducted except that the non-heat-treated deposited plastic film was used for producing the laminated film, thereby preparing a sample for evaluation. The obtained sample was hydrothermally treated in an autoclave at 120° C. for 30 min to measure an oxygen permeability thereof before and after the hydrothermal treatment. The results are shown in Table 1.

COMPARATIVE EXAMPLES 3 to 6

The same procedure as defined in Example 1 was conducted except that the deposited plastic film was heat-treated for 3 days at 40° C., for 3 hours at 60° C., for 30 min at 120° C. and for 1 min at 150° C. The results are shown in Table 2. In Comparative Example 3, the sample was further subjected to nano-scratch measurement and evaluation of softening of the anchor coat layer upon the heat treatment. The results are shown in Table 3.

TABLE 1

| Examples | Kind of anchor coat layer | Layer structure | Heat-treating conditions Temp. (° C.) | Time | Method (condition upon treatment) |
|---|---|---|---|---|---|
| Example 1 | A | PET(SiOx)/CPP | 60 | 3 months | Sheet |
| Example 2 | A | PET(SiOx)/CPP | 70 | 3 days | Sheet |
| Example 3 | A | PET(SiOx)/CPP | 80 | 3 days | Sheet |
| Example 4 | A | PET(SiOx)/CPP | 90 | 3 days | Sheet |
| Example 5 | A | PET(SiOx)/CPP | 100 | 1 day | Sheet |
| Example 6 | A | PET(SiOx)/CPP | 100 | 3 days | Sheet |
| Example 7 | A | PET(SiOx)/CPP | 150 | 10 min | Sheet |
| Example 8 | B | PET(SiOx)/CPP | 150 | 10 min | Sheet |
| Example 9 | C | PET(SiOx)/CPP | 150 | 10 min | Sheet |
| Example 10 | A | PET(SiOx)/CPP | 80 | 3 days | Roll |
| Example 11 | A | PET(SiOx)/ONY/CPP | 80 | 3 days | Roll |
| Example 12 | A | ONY/PET(SiOx)/CPP | 80 | 3 days | Roll |
| Example 13 | A | PET(SiOx)/CPP | 80 | 3 days | Sheet after lamination |

| Examples | Oxygen permeability ($cc/m^2/day/atm$) Before hydrothermal treatment (a) | After hydrothermal treatment (b) | (b)/(a) |
|---|---|---|---|
| Example 1 | 1.4 | 6.6 | 4.7 |
| Example 2 | 0.9 | 1.1 | 1.2 |
| Example 3 | 0.6 | 1.2 | 2.0 |
| Example 4 | 0.4 | 0.9 | 2.0 |
| Example 5 | 0.5 | 1.3 | 2.5 |
| Example 6 | 0.6 | 1.0 | 1.6 |
| Example 7 | 0.8 | 1.4 | 1.8 |
| Example 8 | 1.0 | 4.7 | 4.8 |
| Example 9 | 0.9 | 3.7 | 4.1 |
| Example 10 | 0.4 | 0.8 | 2.3 |

TABLE 1-continued

| Example 11 | 1.0 | 3.1 | 3.1 |
| Example 12 | 0.8 | 3.1 | 3.9 |
| Example 13 | 0.7 | 1.6 | 2.2 |

TABLE 2

| Comparative Examples | Kind of anchor coat layer | Layer structure | Heat-treating conditions | | |
|---|---|---|---|---|---|
| | | | Temp. (° C.) | Time | Method (condition upon treatment) |
| Comparative Example 1 | A | PET(SiOx)/CPP | | untreated | |
| Comparative Example 2 | A | PET(SiOx)/ONY/CPP | | untreated | |
| Comparative Example 3 | A | PET(SiOx)/CPP | 40 | 3 days | Sheet |
| Comparative Example 4 | A | PET(SiOx)/CPP | 60 | 3 h | Sheet |
| Comparative Example 5 | A | PET(SiOx)/CPP | 120 | 30 min | Sheet |
| Comparative Example 6 | A | PET(SiOx)/CPP | 150 | 1 min | Sheet |

| Comparative Examples | Oxygen permeability ($cc/m^2/day/atm$) | | |
|---|---|---|---|
| | Before hydrothermal treatment (a) | After hydrothermal treatment (b) | (b)/(a) |
| Comparative Example 1 | 1.4 | 79.5 | 56.8 |
| Comparative Example 2 | 1.0 | 30.4 | 30.4 |
| Comparative Example 3 | 1.2 | 75.9 | 63.2 |
| Comparative Example 4 | 1.2 | 71.4 | 59.5 |
| Comparative Example 5 | 1.0 | 20.4 | 20.4 |
| Comparative Example 6 | 1.0 | 9.6 | 9.6 |

TABLE 3

| Examples and Comparative Examples | Nano-scratch measurement: critical load (μN) | Softening of anchor coat layer upon heat treatment |
|---|---|---|
| Example 3 | 8.0 | None |
| Example 7 | 4.8 | None |
| Example 9 | 10.0 | None |
| Comparative Example 1 | 1.2 | Occurred |
| Comparative Example 3 | 1.3 | Occurred |

INDUSTRIAL APPLICABILITY

The gas-barrier laminate according to the present invention can maintain an excellent gas-barrier property even after being subjected to hydrothermal treatments and, therefore, can show an excellent keeping property. Also, since the gas-barrier laminate can usually exhibit a high transparency without using an aluminum foil, it is possible to inspect metal foreign materials in the contents and conduct an appearance inspection thereof. Therefore, according to the present invention, there is provided a valuable packaging base material for packaging contents that are subjected to hydrothermal treatments such as retort treatment and sterilization treatment in the application fields of foods and medicines.

The invention claimed is:

1. A gas-barrier film comprising a base film, an anchor coat layer and a metal compound thin film in this order,
    which metal compound thin film has a thickness of 3 to 20 nm and comprises a metal compound selected from the group consisting of oxides, carbides and nitrides of metals, and mixtures thereof,
    which gas-barrier film has an oxygen permeability of not more than 3 $cc/m^2/day/atm$ and has such properties that when a laminate comprising the gas-barrier film and an unstretched polypropylene film having a thickness of 50 μm which is laminated on the metal compound thin film of the gas-barrier film is subjected to a hydrothermal treatment at 120° C. for 30 min, a change in oxygen permeability of the laminate between before and after the hydrothermal treatment (after/before) is not more than 5; and
    a critical load when being subjected to nano-scratch measurement on a surface of the metal compound thin film is not less than 2.0 μN.

2. A gas-barrier film according to claim 1, wherein the base film comprises polyester or polyamide.

3. A gas-barrier film according to claim 1, wherein the metal compound thin film is a deposited film comprising silicon oxide.

4. A gas-barrier film according to claim 1, wherein the change in oxygen permeability of the gas-barrier film between before and after the hydrothermal treatment (after/before) is not more than 4.

* * * * *